(12) United States Patent
Zhang et al.

(10) Patent No.: US 8,527,253 B2
(45) Date of Patent: Sep. 3, 2013

(54) MODELING AN ARBITRARILY POLARIZED ILLUMINATION SOURCE IN AN OPTICAL LITHOGRAPHY SYSTEM

(75) Inventors: Qiaolin Zhang, Sunnyvale, CA (US); Hua Song, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 784 days.

(21) Appl. No.: 11/851,021

(22) Filed: Sep. 6, 2007

(65) Prior Publication Data

US 2009/0070083 A1    Mar. 12, 2009

(51) Int. Cl.
*G06F 17/50*    (2006.01)

(52) U.S. Cl.
USPC .......................................................... 703/13

(58) Field of Classification Search
USPC .......................................................... 703/4, 13
See application file for complete search history.

(56) References Cited

U.S. PATENT DOCUMENTS

| | | | |
|---|---|---|---|
| 7,079,223 B2* | 7/2006 | Rosenbluth et al. | 355/67 |
| 7,352,439 B2* | 4/2008 | Van De Mast et al. | 355/53 |
| 2006/0176493 A1* | 8/2006 | Larsen et al. | 356/625 |
| 2010/0058263 A1* | 3/2010 | Tyminski et al. | 716/5 |

OTHER PUBLICATIONS

Adam et al., Polarization effects in immersion lithography, J. Microlith., Microfab., Microsyst. 4(3), 031106 (Jul.-Sep. 2005).*
Totzeck et al., Polarization influence on imaging, J. Microlith., Microfab., Microsyst. 4(3), 031108 (Jul.-Sep. 2005).*
Donis G. Flagello; Bernd Geh; Steven G. Hansen; Michael Totzeck, 2005, Polarization effects associated with hyper-numerical-aperture (> 1) lithography, J. Microlith., Microfab., Microsyst. Proc. SPIE. 5645, pp. 1-17.*

* cited by examiner

*Primary Examiner* — Mary C Jacob
*Assistant Examiner* — Aniss Chad
(74) *Attorney, Agent, or Firm* — Park, Vaughan, Fleming & Dowler, LLP; Fang Chen

(57) ABSTRACT

One embodiment of the present invention provides a system that accurately models polarization states of an illumination source in an optical lithography system for manufacturing integrated circuits. During operation, the system starts by receiving a two-dimensional (2D) grid map for an illumination source pupil in the optical lithography system. The system then constructs a source-polarization model for the illumination source by defining a polarization state at each grid point in the grid map. Next, the system enhances a lithography model for the optical lithography system by incorporating the source-polarization model into the lithography/OPC model.

20 Claims, 5 Drawing Sheets

302

304

306

308

MODELING AN ARBITRARILY POLARIZED ILLUMINATION SOURCE IN AN OPTICAL LITHOGRAPHY SYSTEM

RELATED APPLICATION

The subject matter of this application is related to the subject matter in a co-pending non-provisional application by the inventors Qiaolin Zhang, Hua Song, and Kevin D. Lucas, and filed on the same day as the instant application entitled, "Method and Apparatus for Modeling a Vectorial Polarization Effect in an Optical Lithography System," Ser. No. 11/51, 011, and filing date Sep. 6, 2007.

BACKGROUND

1. Field of the Invention

The present invention relates to the process of semiconductor manufacturing. More specifically, the present invention relates to a method and an apparatus for accurately modeling an arbitrarily polarized illumination source in an optical lithography system used in a semiconductor manufacturing process.

2. Related Art

Dramatic improvements in semiconductor integration circuit (IC) technology presently make it possible to integrate hundreds of millions of transistors onto a single semiconductor IC chip. These improvements in integration densities have largely been achieved through corresponding improvements in semiconductor manufacturing technologies. Semiconductor manufacturing technologies typically include a number of processes which involve complex physical and chemical interactions. Since it is almost impossible to find exact formulae to predict the behavior of these complex interactions, developers typically use process models which are fit to empirical data to predict the behavior of these processes. In particular, various process models have been integrated into Optical Proximity Correction (OPC)/Resolution Enhancement Technologies (RET) for enhancing imaging resolutions during optical lithographic processes.

More specifically, during an OPC/RET modeling process, one or more process models are used to make corrections to a semiconductor chip layout in a mask to compensate for undesirable effects of complex lithographic processes. An OPC/RET/DFM(Design for manufacturing) model ("OPC model" hereafter) is typically composed of a physical optical model and an empirical process model. An OPC simulation engine uses the OPC model to iteratively evaluate and modify edge segments in the mask layout. In doing so, the OPC simulation engine computes the correct mask patterns which produce physical patterns on wafers that closely match a desired design layout. Note that the effectiveness of the corrected mask patterns is typically limited by the accuracy of the OPC model.

As Moore's law drives IC features to increasingly smaller dimensions (which are now in the deep submicron regime), a number of physical effects, which have been largely ignored or oversimplified in existing OPC models, are becoming increasingly important for OPC model accuracy. Hence, it is desirable to provide more comprehensive, physics-centric descriptions for these physical effects to improve OPC model accuracy.

In particular, the polarization behavior of an optical lithographic system is one of the physical effects that are inadequately represented in a traditional OPC model. While existing OPC models can model the polarization behavior of light and optical lithographic systems in some very limited aspects (i.e., polarization-state-dependent refraction, transmission and reflection in thin films on a wafer), these models are not capable of modeling the more complex polarization-state-dependent vectorial behavior of light in an illumination source and in a projection lens pupil of the lithographic system.

More specifically, the existing OPC models treat a projection lens system as a simple scalar lens pupil, which acts on the incoming optical field homogeneously and independently of the polarization state of the optical field. Consequently, these models cannot accurately and adequately capture the polarization state change of the incident field imposed by the projection lens system. Furthermore, the existing OPC models treat the whole illumination source as either an unpolarized light or a single state (TE/TM/X/Y) uniformly polarized light, while a realistic illumination source can have a much more complex polarization state which varies with location within the illumination source pupil. These oversimplified illumination source models make the modeling accuracy and fidelity of an OPC model inadequate for ever-decreasing feature sizes.

Hence, what is needed is a method and an apparatus that can accurately model an arbitrarily polarized illumination source without the above-described problems.

SUMMARY

One embodiment of the present invention provides a system that accurately models polarization states of an illumination source in an optical lithography system for manufacturing integrated circuits. During operation, the system starts by receiving a two-dimensional (2D) grid map for an illumination source pupil in the optical lithography system. The system then constructs a source-polarization model for the illumination source by defining a polarization state at each grid point in the grid map. Next, the system enhances a lithography model for the optical lithography system by incorporating the source-polarization model into the lithography/OPC model.

In a variation on this embodiment, the system defines the polarization state at each grid point by specifying a degree of polarization at each grid point.

In a further variation on this embodiment, the system decomposes the illumination source at each grid point into an unpolarized component and a completely polarized component based on the degree of polarization.

In a further variation, the system defines the polarization state by specifying a polarization state vector at each grid point. The polarization state vector comprises a total electrical field intensity or magnitude at the grid point; the degree of polarization at the grid point; an azimuthal angle associated with the completely polarized component; and a phase lag associated with the completely polarized component.

In a further variation, the system derives the polarization state vector at a given grid point from a Stokes vector measured at the given grid point.

In a further variation, the system decomposes the completely polarized component into two orthogonal electrical field components based on the azimuthal angle and the phase lag.

In a further variation, the system incorporates the source-polarization model into the lithography model by separately applying a transfer matrix for the lithography system to the unpolarized component and to the completely polarized component.

In a variation on this embodiment, the system defines the polarization state by specifying a Jones vector at each grid point.

In a variation on this embodiment, the system defines the polarization state by specifying a coherency matrix at each grid point.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit Design Flow

Figure 1:
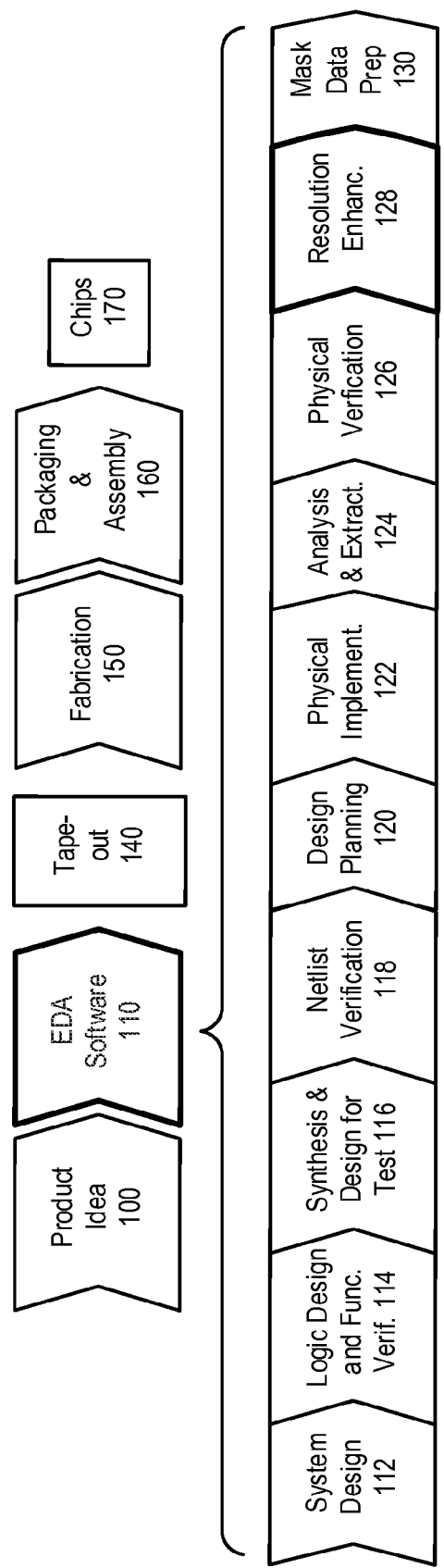
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): The designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level; this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Progen, Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above-described steps. Specifically, one embodiment of the present invention can be used during resolution enhancement step 128.

Terminology

Throughout the specification, the following terms have the meanings provided herein, unless the context clearly dictates otherwise. The terms "light," "optical field," and "electrical field" are used interchangeably to refer to optical radiation emanating from an illumination source of the lithography system. The terms "illumination pupil" and "illumination source pupil" both refer to a plane in the illumination source wherein a two-dimensional grid map can be overlaid to facilitate a point-by-point description of the illumination source.

Overview

Prior art illumination source models treat the illuminator as either an unpolarized source (i.e., the illuminator is completely unpolarized with the same amount of incoherent x polarized and y polarized components) or a uniformly single-state polarized source. Unfortunately, these models cannot adequately represent the true illuminator polarization state which is significantly more complex and can vary spatially across the illuminator.

Embodiments of the present invention provide an accurate illumination source model, which is capable of describing an arbitrarily polarized illumination source with arbitrarily complex spatial variation of the polarization state across the illumination source pupil. More specifically, the present invention provides a point-by-point polarization-state description on an illumination source to capture both local polarization states and spatial variations of polarization states.

Optical Lithography System

Figure 2:
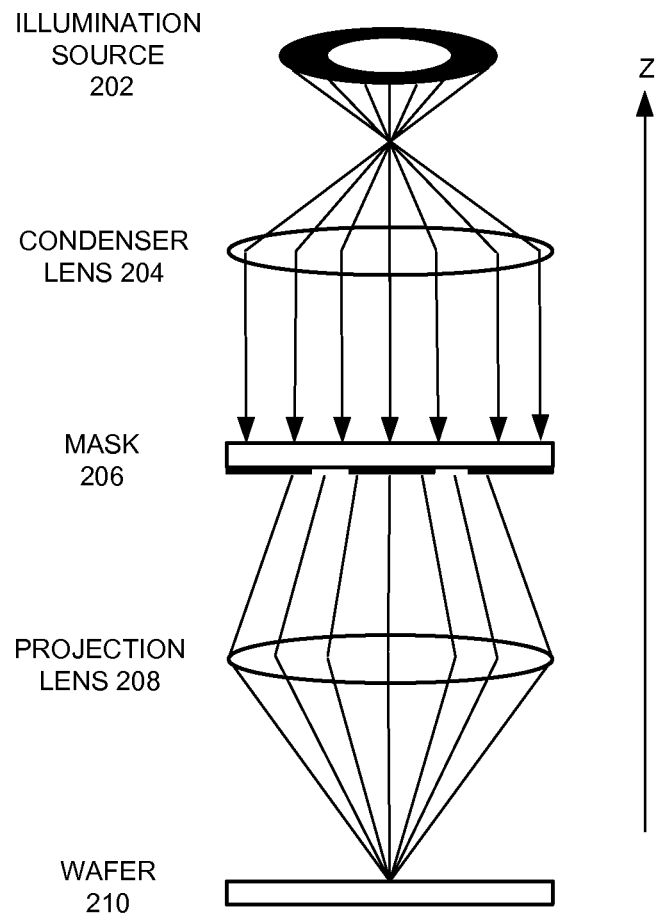
FIG. 2 illustrates a typical optical lithography system in accordance with an embodiment of the present invention.

FIG. 2 illustrates a typical optical lithography system in accordance with an embodiment of the present invention. As shown in FIG. 2, optical radiation emanates from an illumination source 202, which can include any suitable source of radiation such as a laser, and can be of any suitable wavelength for photoresist exposure. This optical radiation passes through a condenser lens 204, and then through a mask 206. Mask 206 defines integrated circuit patterns to be printed (i.e., fabricated) onto a wafer 210.

The image of mask 206 passes through projection lens 208, which focuses the image onto wafer 210. Note that projection lens 208 can include a plurality of lenses configured to achieve a high-NA and other desirable optical properties. During operation, the above-described lithograph system transfers circuitry defined by mask 206 onto wafer 210. Wafer 210 is a semiconductor wafer coated with a thin-film stack. The thin-film stack typically comprises a photoresist layer, or more generally any item to be exposed by the system.

Note that illumination source 202 can include a "traditional illumination source" or a "modified illumination source." A traditional illumination source typically refers to a single large opening which allows most of the illumination to pass through. In contrast, a modified illumination source includes a specially configured metal plate positioned directly in front of a physical light source. More specifically, the metal plate is typically configured with one or more symmetrically arranged apertures or openings to produce a modified illumination effect.

Figure 3:
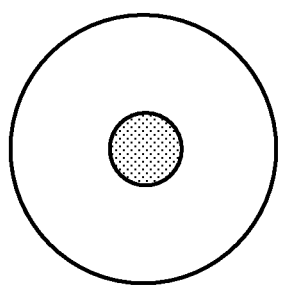
FIG. 3 illustrates common configurations for a modified illumination source.
Figure 3:
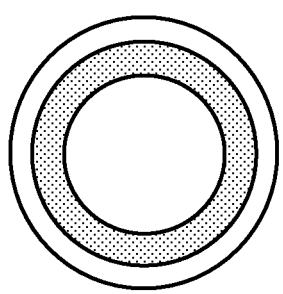
Figure 3:
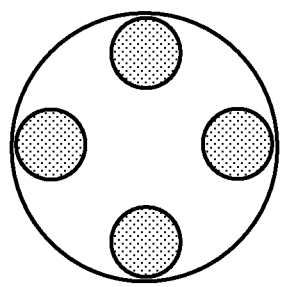
Figure 3:
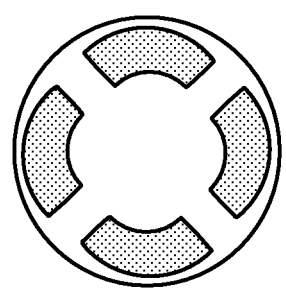

FIG. 3 illustrates some common configurations for a modified illumination source. More specifically, aperture configuration 302 is referred to as a "small sigma illumination source;" aperture configuration 304 is referred to as an "annular illumination source;" aperture configuration 306 is referred to as a "quadrupole illumination source;" and aperture configuration 308 is referred to as a "quasar illumination source." Note that in all of these configurations, the aperture regions are illustrated by shading while the opaque regions are illustrated in white.

As seen in FIG. 3, many aspects of the aperture configurations, including the size, geometry, position, boundary effect, and interference between adjacent apertures, can cause spatial variation of polarization states within each aperture.

Note that the present invention is not limited to the illustrated configurations. In general, the present invention can be applied to any modified illumination source.

In the following discussion, we define the central axis (i.e., the vertical axis) of the lithography system in FIG. 2 as the z-axis. Hence, a plane in the lithography system perpendicular to the z-axis is an x-y plane, including illumination pupil plane.

Point-by-Point Polarization Description of an Illumination Source

Figure 4A:
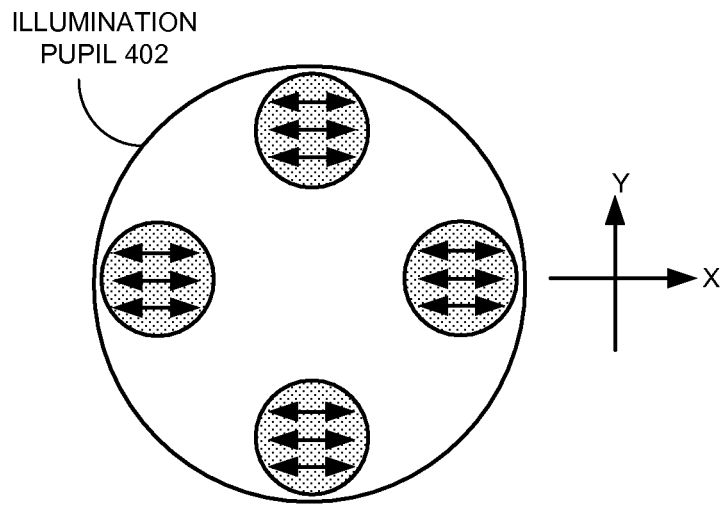
FIG. 4A illustrates a polarization specification for a quadrupole illumination source in a prior art lithograph model.

FIG. 4A illustrates a polarization specification for a quadrupole illumination source in a prior art lithograph model. More specifically, FIG. 4A provides an x-y plane view of an illumination pupil 402. Note that a uniform single-state-polarization is used to describe the polarization state within each aperture (or pole) in illumination pupil 402. Hence, this polarization model does not include spatial variation of the polarization state within each pole and between different poles.

Figure 4B:
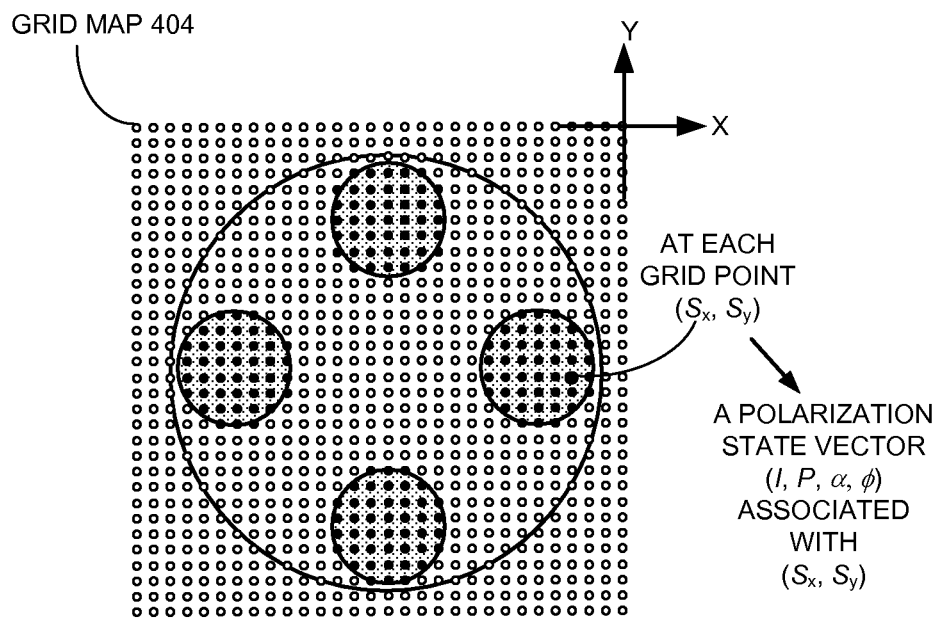
FIG. 4B illustrates the process of constructing a point-by-point source-polarization model for the quadrupole illumination source in FIG. 4A in accordance with an embodiment of the present invention.

FIG. 4B illustrates the process of constructing a point-by-point source-polarization model for the quadrupole illumination source in FIG. 4A in accordance with an embodiment of the present invention. Note that a two-dimensional (2D) grid map 404 is superimposed on illumination pupil 402, wherein 2D grid map 404 is composed of a 2D array of grid points. Also note that grid points within each pole are shown as filled circles whereas grid points outside the openings are shown as open circles. Embodiments of the present invention consider those grid points within the openings or on the boundaries of the openings (i.e., the filled circles) as illumination source points. Because light can scatter outside of the openings, some embodiments of the present invention also consider the grid points outside of the openings (i.e., the open circles). For example, one embodiment of the present invention treats all grid points within grid map 404 as illumination source points to build a comprehensive description of illumination polarization state over the entire illumination pupil plane.

Because illumination pupil 402 is in the x-y plane, grid map 404 is defined in the x-y plane so that each grid point in grid map 404 is associated with location coordinates $(S_x, S_y)$. In another embodiment, grid map 404 is defined in a radial coordinate system, so that each grid point is associated with radial coordinates $(S_r, S_\theta)$. Embodiments of the present invention can also use grid map configurations other than the particular configuration of grid map 404. In general, the present invention can use any 2D grid map configuration as long as it comprises a sufficient number of grid points across illumination pupil 402 especially within each opening to capture the spatial variation in light polarization state. Note that some of the grid points are located on (or are substantially proximate to) the boundaries of the openings.

Embodiments of the present invention next define a specific polarization state for each source grid point $(S_x, S_y)$ within illumination pupil 402, wherein the polarization state specifies the local polarization state at a grid point $(S_x, S_y)$. Consequently, we refer to this source-polarization model as a point-by-point polarization-state model. Note that using this point-by-point description effectively captures spatial variations of the polarization state in the illumination pupil.

In one embodiment of the present invention, the polarization state at a given grid point $(S_x, S_y)$ within illumination pupil 402 is specified by a "polarization state vector." More specifically, for grid point $(S_x, S_y)$, the polarization state vector specifies a total electrical field intensity (or magnitude) I; a degree of polarization P, which specifies a ratio of a polarized component to the total intensity I; an azimuthal angle $\alpha$ of a polarization vector associated with the completely polarized component; and a phase lag $\phi$ between two orthogonal electrical field components decomposed from the completely polarized component. Hence, the polarization state vector can be expressed as $(I, P, \alpha, \phi)$, wherein I, P, $\alpha$, $\phi$ can all depend on the location $(S_x, S_y)$. Note that this polarization state vector can be derived from a Stokes vector, which is measurable at each grid point.

More specifically, the degree of polarization P is defined as:

$$P = \frac{I_{pol}}{I_{pol} + I_{unpol}}, \quad (1)$$

wherein $I_{pol}$ represents the polarized light intensity, $I_{unpol}$ represents the unpolarized light intensity, and $I_{pol}+I_{unpol}$ is the total light intensity I at the grid point. Hence, using the degree of polarization P and total electrical field intensity I, one can decompose an arbitrary polarization state at grid point $(S_x, S_y)$ into an unpolarized source component and a completely polarized source component, such that:

$$I_{pol}=PI,$$

$$I_{unpol}=(1-P)I. \quad (2)$$

Upon separating the unpolarized source component from the completely polarized source component at each grid point within illumination pupil 402, embodiments of the present invention can perform separate operations on the two distinct components using two lithography models that are specifically built for each of these components. More specifically, one lithography model computes a contribution from the completely polarized source component to the image intensity on the wafer, while the other lithography model computes a contribution from the unpolarized source component to the wafer image intensity. Hence, the final image intensity on the wafer due to an arbitrarily polarized illumination source is the sum of the above two contributions.

In one embodiment of the present invention, the unpolarized source component at a given grid point is described by an unpolarized electrical field vector $E_{up}$. Furthermore, $E_{up}$ can be decomposed into two equally intense, but incoherent electrical fields with orthogonal polarizations, for example into x-polarized component-$E_x$ and y-polarized component-$E_y$ in the x-y coordinates, such that:

$$E_x = \frac{1}{\sqrt{2}} E_{up}, \quad E_y = \frac{1}{\sqrt{2}} E_{up}, \quad (3)$$

wherein $E_{up}$ is the amplitude of $E_{up}$.

In one embodiment of the present invention, the light intensity at the image plane (on the wafer) due to the unpolarized source component can be computed by using:

$$I_{image\_unpol}(x,y) = \quad (4)$$

$$\int\int\int\int\int\int I_{unpol}(f,g)H(f+f_1,g+g_1)H^*(f+f_2,g+g_2) \sum_{\substack{i=x,y \\ j=x,y \\ k=x,y,z}} M_{ik}(f+f_1,g+g_1)M_{jk}^*(f+f_2,g+g_2)E_iE_j^*O(f_1,g_1)O^*(f_2,g_2)$$

$$e^{-i2\pi[(f_1-f_2)x+(g_1-g_2)y]}dfdgdf_1dg_1df_2dg_2$$

In one embodiment of the present invention, the completely polarized source component at a given grid point is described by an electrical field vector $E_p$, which can include, but is not limited to a linear polarization, a circular polarization, and an elliptical polarization. Furthermore, $E_p$ can be decomposed into two coherent, orthogonal electrical field components, for example into x-polarized component $E_x$ and y-polarized component $E_y$ in the x-y coordinates. In particular for a polarization-state-vector representation, polarization vector $E_p$ is decomposed into $E_x$ and $E_y$ according to the azimuthal angle $\alpha$ and a phase lag $\phi$ between $E_x$ and $E_y$ components, such that:

$$E_x = E_p \cos\alpha, E_y = e^{-j\phi} E_p \sin\alpha \quad (5)$$

wherein $E_p$ is the amplitude of $E_p$.

In one embodiment of the present invention, the light intensity at the image plane (on the wafer) due to the polarized source component can be computed by using:

$$I_{image\_pol}(x,y) = \quad (6)$$

$$\int\int\int\int\int\int I_{pol}(f,g)H(f+f_1,g+g_1)H^*(f+f_2,g+g_2) \sum_{\substack{i=x,y \\ j=x,y \\ k=x,y,z}} M_{ik}(f+f_1,g+g_1)M_{jk}^*(f+f_2,g+g_2)$$

$$E_iE_j^*O(f_1,g_1)O^*(f_2,g_2)$$

$$e^{-i2\pi[(f_1-f_2)x+(g_1-g_2)y]}dfdgdf_1dg_1df_2dg_2$$

Hence, the final image intensity at the image plane can be expressed as:

$$I = I_{image\_pol} + I_{image\_unpol}. \quad (7)$$

Note that in addition to defining the polarization state at each grid point as the above-described polarization state vector, embodiments of the present invention specify a Jones vector at each grid point. Note that a Jones vector is used to describe a completely polarized electrical field component. More specifically, an electrical field E at a given grid point $(S_x, S_y)$ is decomposed into two orthogonal, linearly polarized components $E_x$ and $E_y$, wherein each is associated with an amplitude value and a phase value. The two orthogonal polarization components are then used to construct a Jones vector $$\begin{bmatrix} E_x \\ E_y \end{bmatrix}$$

for the electrical field E. For example, a circular polarized electrical field can be decomposed into linearly polarized fields $E_x$ and $E_y$, which have the same amplitude but are 90 degrees out of phase.

Another embodiment of the present invention uses a coherency-matrix representation for the point-by-point description of an optical field in the illumination pupil. More specifically, the coherency matrix is used to represent a partially polarized, non-monochromatic optical field. Note that a non-monochromatic optical field is a stochastic process. Hence, a coherency matrix is composed of entries that represent time averaged intensities and correlations between components of an electric field. For example, a coherency matrix C can be expressed as:

$$C = \begin{bmatrix} \langle E_x E_x^* \rangle & \langle E_x E_y^* \rangle \\ \langle E_y E_x^* \rangle & \langle E_y E_y^* \rangle \end{bmatrix} = \begin{bmatrix} C_{xx} & C_{xy} \\ C_{yx} & C_{yy} \end{bmatrix}. \quad (8)$$

wherein < > represents a time average operation. Based on the electrical field vector expression of Eqn. (2), the coherency matrix can be explicitly expressed as:

$$C = \begin{bmatrix} E_p^2 \cos^2\alpha & E_p^2 e^{j\phi} \cos\alpha\sin\alpha \\ E_p^2 e^{j\phi} \sin\alpha\cos\alpha & E_p^2 \sin^2\alpha \end{bmatrix}, \quad (9)$$

wherein the (1,1) entry is related to x-polarized component, the (2,2) entry is related to y-polarized component, and the (2,1) and (1,2) entries are related to the coupling between the x- and y-polarized components. The coupling terms are also referred to as the "cross-terms."

Note that although we describe three forms of polarization-state specifications, the general technique of using a point-by-point description of the source-polarization is not meant to be limited to these particular forms. Furthermore, although the above description is used in conjunction with a quadrupole illumination pupil, the general technique is applicable to any type of traditional or modified illuminator.

Figure 5:
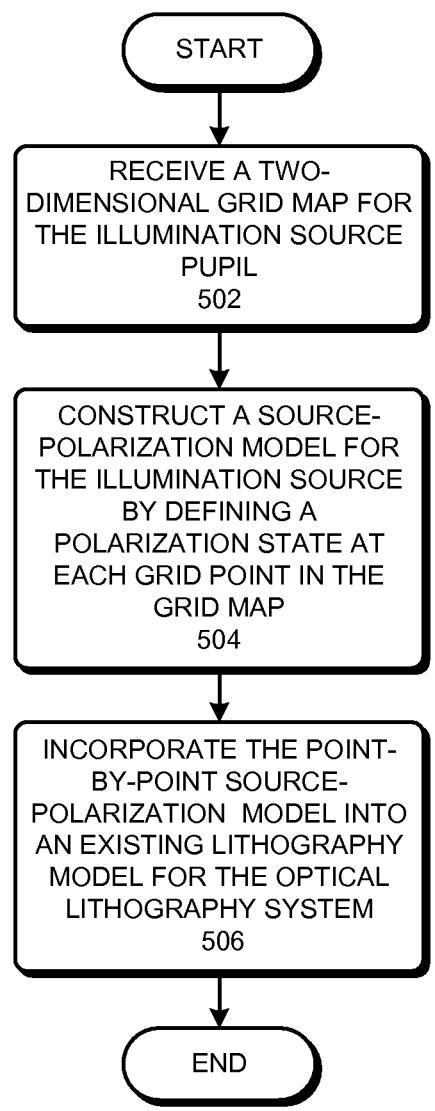
FIG. 5 presents a flowchart illustrating the process of modeling the illumination source polarization in accordance with an embodiment of the present invention.

FIG. 5 presents a flowchart illustrating the process of modeling the illumination-source polarization in accordance with an embodiment of the present invention. During operation, the system receives a 2D grid map for the illumination source pupil (step 502). Generally, embodiments of the present invention can use any suitable 2D grid maps. In one embodiment, the grid map is sufficiently dense so that a sufficient number of grid points are used to provide a high resolution of the spatial variation of the polarization state. In one embodiment, the grid map has the same grid size in both x and y directions.

The system then constructs a source-polarization model for the illumination source by defining a polarization state at each grid point in the grid map (step 504). In one embodiment of the present invention, this point-by-point description of the source polarization can be obtained from the manufacturer of the lithography system where measurements of the illumination source can be directly performed. This polarization state definition can include but is not limited to a polarization state vector, a Jones vector, and a coherency matrix.

Next, the system incorporates the source-polarization model into an existing lithography model for the optical lithography system which does not include a point-by-point polarization description for the illumination source (step 506).

CONCLUSION

Embodiments of the present invention incorporate the point-by-point source-polarization model into an overall lithography model by separately applying a total transfer matrix (which can include a projection-lens-pupil model, a high-NA model, and a thin-film-stack model) for the lithography system to both the polarized source component and unpolarized source component at each grid point within the illumination source. The separate results are then combined to obtain an overall effect due to an arbitrarily polarized illumination source.

The related application listed above provides a lens-pupil-polarization-effect model, which includes a point-by-point description of the polarization state change imposed by the lens pupil. Embodiments of the present invention combine the point-by-point polarization model for the illumination source with the point-by-point polarization effect model for the lens pupil to provide a more comprehensive, physics-centric vectorial polarization model for the lithography system.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for accurately modeling polarization states of an illumination source in an optical lithography system for manufacturing integrated circuits, the method comprising:
    receiving a two-dimensional (2D) grid map for a modified illumination source in the optical lithography system, wherein the 2D grid map comprises a 2D array of grid points, wherein each grid point represents a location in the modified illumination source;
    constructing a source-polarization model for the modified illumination source by defining a polarization state at each grid point in the 2D grid map to facilitate a point-by-point description of the modified illumination source;
    decomposing the modified illumination source at each grid point into an unpolarized component and a completely polarized component; and
    enhancing a lithography model for the optical lithography system by incorporating the source-polarization model into the lithography model, which involves separately applying a transfer matrix associated with the optical lithography system to the unpolarized component and to the completely polarized component.

2. The method of claim 1, wherein defining the polarization state at each grid point involves specifying a degree of polarization at each grid point.

3. The method of claim 2, wherein decomposing the modified illumination source at each grid point into an unpolarized component and a completely polarized component involves decomposing the modified illumination source based on the degree of polarization.

4. The method of claim 3, wherein defining the polarization state involves specifying a polarization state vector at each grid point, wherein the polarization state vector comprises:
    a total electrical field intensity or magnitude at the grid point;
    the degree of polarization at the grid point;
    an azimuthal angle associated with the completely polarized component; and
    a phase lag associated with the completely polarized component.

5. The method of claim 4, wherein the method further comprises deriving the polarization state vector at a given grid point from a Stokes vector measured at the given grid point.

6. The method of claim 4, wherein the method further comprises decomposing the completely polarized component into two orthogonal electrical field components based on the azimuthal angle and the phase lag.

7. The method of claim 1, wherein defining the polarization state involves specifying a Jones vector at each grid point.

8. The method of claim 1, wherein defining the polarization state involves specifying a coherency matrix at each grid point.

9. A non-transitory computer readable storage medium storing instructions that when executed by a computer cause the computer to perform a method for accurately modeling polarization states of an illumination source in an optical lithography system for manufacturing integrated circuits, the method comprising:

receiving a 2D grid map for a modified illumination source in the optical lithography system, wherein the 2D grid map comprises a 2D array of grid points, wherein each grid point represents a location in the modified illumination source;

constructing a source-polarization model for the modified illumination source by defining a polarization state at each grid point in the 2D grid map to facilitate a point-by-point description of the modified illumination source;

decomposing the modified illumination source at each grid point into an unpolarized component and a completely polarized component; and enhancing a lithography model for the optical lithography system by incorporating the source-polarization model into the lithography model, which involves separately applying a transfer matrix associated with the optical lithography system to the unpolarized component and to the completely polarized component.

10. The non-transitory computer readable storage medium of claim 9, wherein defining the polarization state at each grid point involves specifying a degree of polarization at each grid point.

11. The non-transitory computer readable storage medium of claim 10, wherein decomposing the modified illumination source at each grid point into an unpolarized component and a completely polarized component involves decomposing the modified illumination source based on the degree of polarization.

12. The non-transitory computer readable storage medium of claim 11, wherein defining the polarization state involves specifying a polarization state vector at each grid point, wherein the polarization state vector comprises:

a total electrical field intensity or magnitude at the grid point;

the degree of polarization at the grid point;

an azimuthal angle associated with the completely polarized component; and a phase lag associated with the completely polarized component.

13. The non-transitory computer readable storage medium of claim 12, wherein the method further comprises deriving the polarization state vector at a given grid point from a Stokes vector measured at the given grid point.

14. The non-transitory computer readable storage medium of claim 13, wherein the method further comprises decomposing the completely polarized component into two orthogonal electrical field components based on the azimuthal angle and the phase lag.

15. The non-transitory computer readable storage medium of claim 9, wherein defining the polarization state involves specifying a Jones vector at each grid point.

16. The non-transitory computer readable storage medium of claim 9, wherein defining the polarization state involves specifying a coherency matrix at each grid point.

17. An apparatus that accurately models polarization states of an illumination source in an optical lithography system for manufacturing integrated circuits, comprising:

a computer;

a receiving mechanism implemented on the computer and configured to receive a 2D grid map on a modified illumination source in the optical lithography system, wherein the 2D grid map comprises a 2D array of grid points, wherein each grid point represents a location in the modified illumination source;

a constructing mechanism implemented on the computer and configured to construct a source-polarization model for the modified illumination source by defining a polarization state at each grid point in the 2D grid map to facilitate a point-by-point description of the modified illumination source;

a decomposition mechanism implemented on the computer and configured to decompose the modified illumination source at each grid point into an unpolarized component and a completely polarized component; and an incorporating mechanism implemented on the computer and configured to enhance a lithography model for the optical lithography system by incorporating the source-polarization model into the lithography model which involves separately applying a transfer matrix associated with the optical lithography system to the unpolarized component and to the completely polarized component.

18. The apparatus of claim 17, wherein the constructing mechanism is configured to specify a degree of polarization at the grid point.

19. The apparatus of claim 18, wherein the decomposition mechanism is further configured to decompose the modified illumination source at each grid point into an unpolarized component and a completely polarized component based on the degree of polarization.

20. A method for accurately modeling polarization states of an illumination source in an optical lithography system for manufacturing integrated circuits, the method comprising:

receiving a two-dimensional (2D) grid map for a modified illumination source in the optical lithography system, wherein the 2D grid map comprises a 2D array of grid points, wherein each grid point represents a location in the modified illumination source;

constructing a source-polarization model for the modified illumination source by defining a polarization state at each grid point in the 2D grid map to facilitate a point-by-point description of the modified illumination source;

decomposing the modified illumination source at each grid point into an unpolarized component and a completely polarized component;

building a first model for the unpolarized component; and building a second model for the completely polarized component;

wherein an image intensity on a wafer due to an arbitrarily polarized illumination source is a sum of contributions from the first and second models.

* * * * *